United States Patent
Yu et al.

(10) Patent No.: US 7,221,185 B1
(45) Date of Patent: May 22, 2007

(54) METHOD AND APPARATUS FOR MEMORY BLOCK INITIALIZATION

(75) Inventors: Haiming Yu, San Jose, CA (US); Wei Yee Koay, Penang (MY)

(73) Assignee: Altera Corporation, San Jose, CA (US)

( * ) Notice: Subject to any disclaimer, the term of this patent is extended or adjusted under 35 U.S.C. 154(b) by 116 days.

(21) Appl. No.: 11/048,831

(22) Filed: Feb. 1, 2005

(51) Int. Cl.
*H03K 19/173* (2006.01)

(52) U.S. Cl. .................... 326/38; 326/105; 365/189.02

(58) Field of Classification Search ............ 326/37–41, 326/105; 365/189.01, 189.02
See application file for complete search history.

(56) References Cited

U.S. PATENT DOCUMENTS

| | | | | |
|---|---|---|---|---|
| 6,028,445 A | * | 2/2000 | Lawman | ...................... 326/38 |
| 6,765,408 B2 | * | 7/2004 | Cheng et al. | ................. 326/41 |
| 6,856,173 B1 | * | 2/2005 | Chun | ......................... 326/108 |
| 6,924,670 B2 | * | 8/2005 | Azam | ......................... 326/106 |
| 2005/0166105 A1 | * | 7/2005 | Warren | ....................... 714/724 |

* cited by examiner

*Primary Examiner*—Don Le
(74) *Attorney, Agent, or Firm*—Martine Penilla & Gencarella, LLP

(57) ABSTRACT

In one aspect of the invention, a circuit for generating addresses for memory initialization within a programmable logic device (PLD) is provided. The circuit includes input registers, which are loaded and unloaded with data triggered by the edge of a clock. The circuit further includes multiplexers, where the multiplexers are capable of receiving output of the input registers and encoded programmable addresses. The multiplexer generates encoded row addresses for a wordline of a memory within the PLD. The circuit includes a decoder to decode the encoded row addresses for the wordline of the memory.

20 Claims, 7 Drawing Sheets

METHOD AND APPARATUS FOR MEMORY BLOCK INITIALIZATION

BACKGROUND OF THE INVENTION

1. Field of the Invention

The present invention relates generally to programmable logic devices (PLDs). More particularly, the invention relates to memory initialization of PLDs.

2. Description of the Related Art

Programmable logic devices (PLDs) generally include an array of uncommitted elements that can be interconnected in a general way. PLDs provide storage, logic and wires in a standard package that can be programmed by the user according to the specification of the user to make an application specific integrated circuit (ASIC). When first introduced, PLDs had simple designs and were costly, therefore, they were primarily used in prototypes, and emulation systems. Currently, PLDs are relatively inexpensive and include all the features needed to implement most complex hardware designs. As a result, they are used in preproduction applications as well as in marketed products.

With the constant drive to reduce the size of electronic products and their components, it would be beneficial that PLDs be laid out in an efficient manner. That is, in order to reduce the area required by a PLD, the resources of the PLD need to be allocated efficiently so that unwanted additional elements can be avoided to save the real estate required by the PLDs. At the same time the improved layout should not diminish the speed characteristics for the PLD.

The embedded memory block of a PLD typically supports using an initialization file to pre-load the PLD configuration into memory. The addresses used for pre-loading the initialization file are decoded addresses. These addresses are multiplexed and then buffered in order to drive the memory block wordlines, as the multiplexers are incapable of handling the heavy loading required by the memory array in the memory block. This additional circuitry can not only occupy valuable real-estate space, but also affect the speed of the device.

Accordingly, there exists a need for a system and a method for revising the architecture supporting memory pre-loading in a PLD.

SUMMARY OF THE INVENTION

Broadly speaking, the present invention fills these needs by providing a circuit and method for generating row addresses for a wordline in a memory within the embedded memory block of a programmable logic device (PLD) during initialization. The embodiments of the present invention utilize an encoded system and programmable addresses until the very last stage of the address generation process. A decoder is used at the last stage to decode the row addresses of the memory. The row addresses of wordlines are driven directly by the decoder. The present invention takes advantage of the buffers in the decoder to drive the row addresses of the wordlines in the memory within the programmable logic device. The present invention may be implemented in numerous ways, including a device and a method for forming a device. Several embodiments of the present invention are described below.

In one aspect of the invention, a circuit for generating addresses for memory initialization within a programmable logic device (PLD) is provided. The circuit includes input registers that are loaded and unloaded with data triggered by the edge of a clock. The circuit further includes multiplexers, where the multiplexers are capable of receiving output of the input registers and encoded programmable addresses. The multiplexers generate encoded row addresses for a wordline of a memory within the PLD. The circuit includes a decoder to decode the encoded row addresses for the wordline of the memory. The decoder includes buffers that can drive the memory array. Therefore, this architecture takes advantage of the buffers in the decoder by multiplexing the encoded programmable addresses and the system addresses prior to the decoder.

In another aspect of the invention, a method of generating addresses for memory initialization in an embedded memory block within a programmable logic device (PLD) is provided. The method initiates by loading system addresses into a plurality of input registers. The system addresses are capable of changing during a clock edge. The system addresses are then output to a corresponding multiplexer. The input to the multiplexer also includes encoded programmable addresses. In one embodiment, the multiplexer is enabled by the same control signal that selects the programmable addresses. The multiplexer then generates row addresses for a wordline of the memory in the PLD, which are subsequently decoded. The decoded addresses may be used to pre-load an initialization file into the memory.

Yet another aspect of the invention involves a method for efficient memory initialization in a PLD. The method involves loading encoded programmable addresses to a plurality of multiplexers. The multiplexers also receive corresponding encoded system addresses. The multiplexers multiplex the encoded programmable addresses with the corresponding encoded system addresses to define row addresses. Subsequently, the multiplexed row addresses are decoded to generate row addresses for a memory within the PLD.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention for initialization of PLDs is provided. In the present invention, the programmable addresses are multiplexed with the system addresses from an input register, prior to decoding, so that the number of multiplexers can be reduced thereby avoiding the buffer stage. The decoders include buffers so that the need for additional buffers to drive the heavy loading of the memory array is eliminated.

Figure 1:
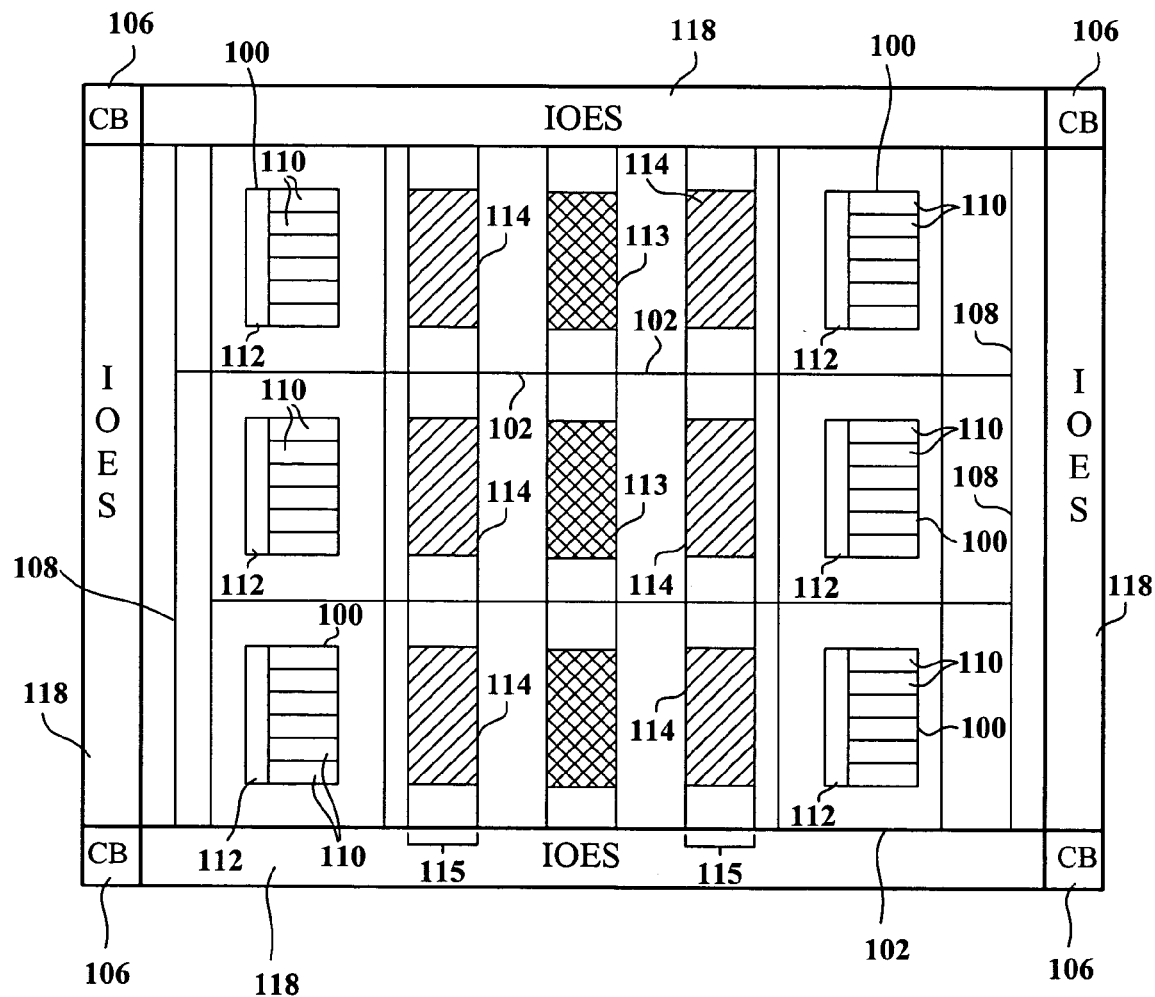
FIG. 1 is a simplified high level schematic diagram of the layout of a field programmable gate array (FPGA) in accordance with an embodiment of the invention.

FIG. 1 is a simplified schematic diagram of the layout of a field programmable gate array (FPGA) in accordance with an embodiment of the invention. The FPGA is used to illustrate the basic structure and functionality of a PLD. One skilled in the art will understand and appreciate that other types of PLDs may be used in place of FPGAs. The layout includes input/output circuitry blocks (IOEs) 118. FIG. 1 further includes logical array blocks 100. Logical array blocks (LABs) 100 are a physically grouped set of logical resources configured or programmed to perform logical functions desired by the user. LABs 100 are comprised of varying number of logic elements (LEs) 110, which are a basic building block of a PLD. FIG. 1 further includes horizontal interconnects 102 and vertical interconnects 108. Although shown as single lines in FIG. 1, each of horizontal and vertical interconnects 102 and 108 may represent a plurality of signal conductors. LABs 100 may have inputs and outputs (not shown), which may or may not be programmably connected to horizontal and vertical interconnects 102 and 108, respectively. LEs 110 may also be programmably connected to horizontal and vertical interconnects 102 and 108, respectively, via local interconnects 112. Control blocks 106 of the FPGA generate the programming addresses. When the FPGA is initially programmed, the programming information is generally contained in another chip that communicates with the control blocks 106 of the FPGA. The control blocks 106 decode the communication from the other chip and generate programming addresses. One skilled in the art should understand and appreciate that the number of control blocks in a FPGA can vary.

The FPGA in FIG. 1 is also shown to include embedded-memory array blocks 115. Each of the memory blocks 114, within the embedded-memory array block 115, may have a different size. For example, the first memory block may be a small-embedded-memory block (SEAB) while the second and third ones may be a medium-embedded-memory block (MEAB) and mega-RAM block (MRAM) respectively. Each of the mentioned memory blocks 114 may also include their own control logic and circuits. One skilled in the art should understand and appreciate that the names are arbitrarily assigned to the different memory blocks. The size of each of the memory blocks can vary. A typical SEAB size might be 32×18, i.e., 32 words deep and 18 bits wide, for a total of 576 bits. A typical size of the MEAB is around 128×36, i.e., 128 words deep and 36 bits wide, for a total of 4608 bits. A typical size of an MRAM is 64K×9, i.e., 64 Kilobytes deep and a minimum word width of 9 bits, for a total of 589824 bits. The sizes provided above for the SEAB, MEAB, and MRAM are exemplary and can be changed according to the need. Additionally, groups of individual SEABs, MEABs, and MRAMs can be configured to have different depths and widths. The memory blocks of the kinds described above may be used to store data for use in performing logic functions. The memory blocks may also be used as different types of memories such as read only memory (ROM), random access memory (RAM), and first in first out (FIFO), etc. FIG. 1 also illustrates embedded multipliers 113. It should be appreciated that the functional blocks included in the FPGA of FIG. 1 are exemplary and the FPGA may include numerous other known functional blocks which are not included in FIG. 1, e.g., a digital signal processing block.

In one embodiment, the PLDs of the kind describe above with respect to FIG. 1, have a programmable mode and a system mode. During the programmable mode, PLDs are programmed by the user. Initially, when the chip is being programmed, the programming addresses are loaded into the memory block. Once programmed, the designs are mapped into the PLD chip. For a non-volatile PLD chip, the programming needs to be conducted only once. Once the programming is completed, the programming addresses can be disabled. During the system mode, the user realizes the logic functions performed by the design. Therefore, during the system mode the system addresses may change during every clock cycle.

Figure 2A:
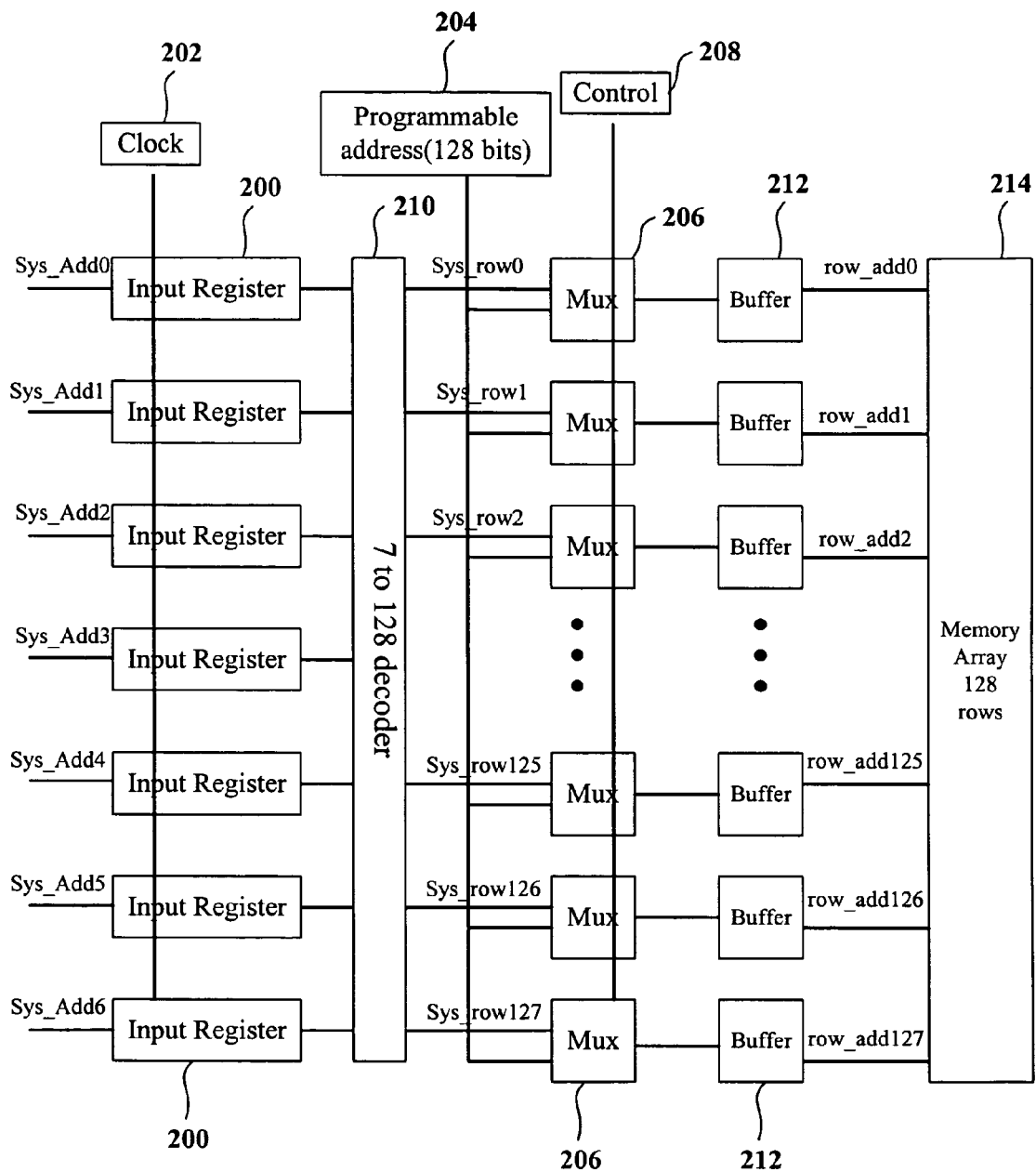
FIG. 2A illustrates a system for generating addresses to initialize memory within a PLD.

In accordance with the principles of the present invention, FIG. 2A shows an exemplary system for generating addresses to initialize memory, in RAM or ROM mode, of a PLD embedded memory block as described with reference to FIG. 1. The system includes input registers 200. In system mode, system addresses are passed into the input registers 200. FIG. 2A further shows clock 202, which supplies timing signals to input registers 200. As shown, each of the input registers 200 have the same clock and the data is passed into the registers 200 according to the clock edge. It should be appreciated that the data, e.g., the system addresses, can be passed in and out of the registers 200 at the rising edge or the falling edge of the clock cycle or any other combination thereof. The system addresses shown here, include 7 addresses. One skilled in the art will understand and appreciate that even though the system addresses are shown to be 7 in number, this number of addresses can vary according to the size of the memory array which is to be pre-loaded. Further, the system addresses illustrated in this embodiment are encoded addresses.

The system of FIG. 2A further shows a decoder 210. The decoder 210 receives the output from the input registers 200. The exemplary decoder 210 receives the 7 encoded system addresses and decodes them to 128 system row addresses. As described above, a typical MEAB has 128 wordlines, therefore the exemplary system of FIG. 2A is illustrated to include 128 wordlines. The system of FIG. 2 further includes multiplexers 206. The multiplexers 206 receive the decoded system row addresses from the decoder 210. The multiplexers also receive 128 programmable addresses 204 from the control block (not shown). The multiplexers are controlled by the control signal 208. Therefore, during initialization, the multiplexers are enabled by the control signal 208 selecting the programmable addresses or the system addresses. The multiplexers 206, selects one of the programmable addresses or the system addresses to generate a final row of addresses of the wordline for the memory array 214. As the multiplexers 206 are incapable of driving a load required for the memory array, the system further includes buffers 212. The system of FIG. 2 is shown to include 128 buffers to drive the 128 rows of the memory array. In one embodiment, the buffers 212 may be inverters. The size of the buffers depends on the load of the memory array that is to be driven by the buffers.

Figure 2B:
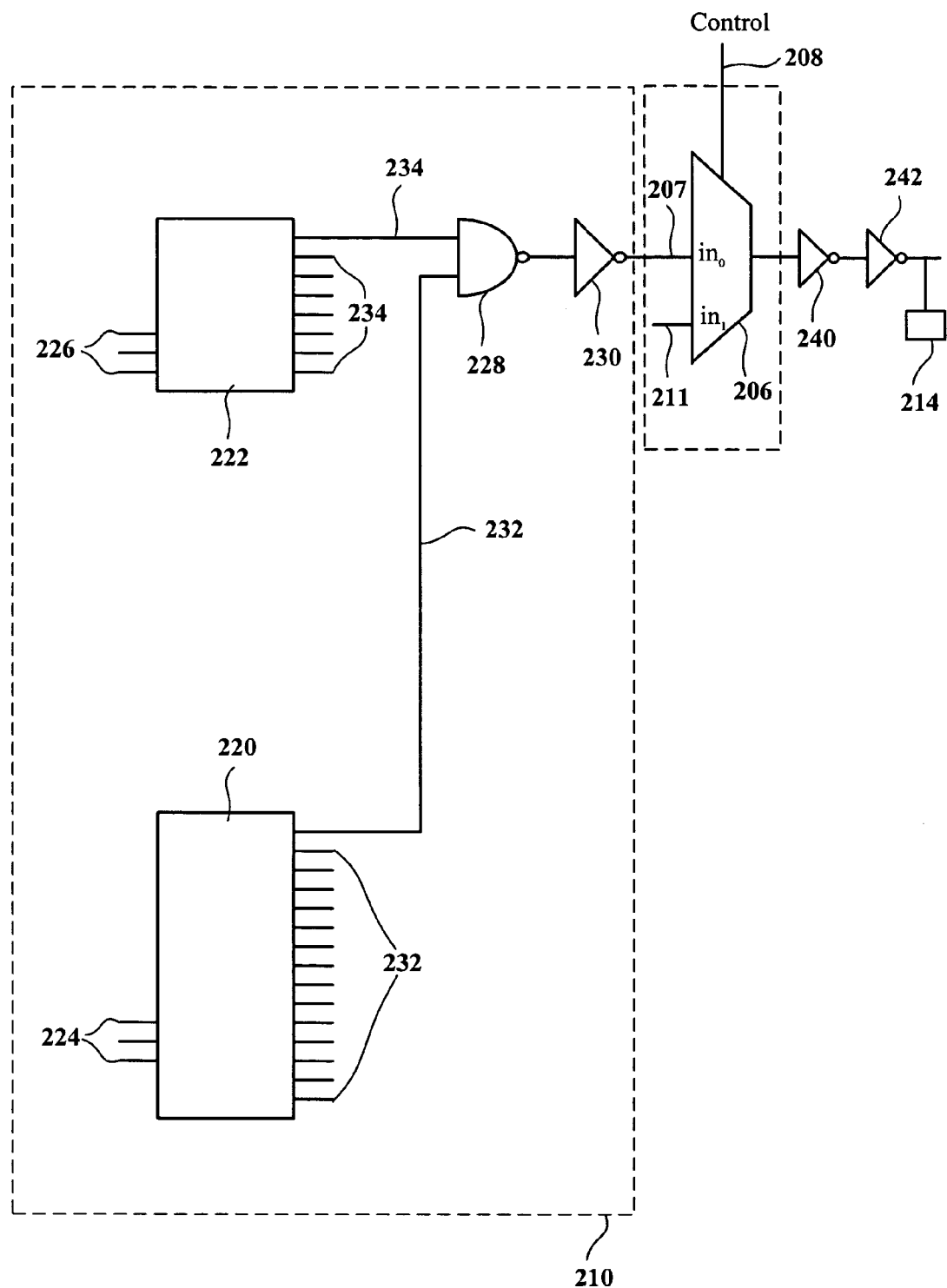
FIG. 2B is a simplified schematic representation of FIG. 2A.

FIG. 2B is a simplified schematic representation of FIG. 2A in accordance with an embodiment of the present invention. FIG. 2B illustrates the decoder 210, which corresponds to the decoder of FIG. 2A. The decoder 210 includes two decoders 220 and 222. Decoder 220 decodes four input signals 224, i.e. encoded system addresses, to 16 output signals 232. Similarly, decoder 222 decodes three input signals 226, i.e. encoded system addresses, to 8 output signals 234. One of the 16 output signals from decoder 220 and one of the output signals from decoder 222 are input into the NAND gate 228. The different combinations of the output signals from decoder 220 and 222 provide a total of 128 combinations of signals representing the 128 system addresses of FIG. 2A. As shown, the output of the NAND gate 228 is negated by the inverter 230.

FIG. 2B further illustrates a multiplexer 206. The multiplexer 206 is designed to make a 2-1 selection. As shown, the multiplexer 206 has two inputs 207 and 211. The output of the inverter 230 functions as the input 207 of the multiplexer 206. In this embodiment, the input 207 is the system address and the input 211 is the programmable address. The multiplexer 206 is controlled by control signals 208. The control signal controls the selection of a particular input line from the input lines 207 and 211. The outputs from the multiplexers cannot be passed directly to the memory array 214, as the multiplexer is incapable of driving a heavy load. Therefore, buffers 240 and 242 are included and the buffers serve to drive the heavy loading of memory array 214. One skilled in the art should appreciate and understand that FIG. 2B shows only one set of NAND gate 228, inverter 230, multiplexer 206, and buffers 240 and 242. The actual number of NAND gate 228, inverter 230, multiplexer 206, and buffers 240 and 242 depends on the size of the memory array. Generally $2^n$ number of NAND gate 228, inverter 230, multiplexer 206, and buffers 240 and 242 are needed. In this example, n=7 since the memory array is shown to include 128 wordlines.

Figure 2C:
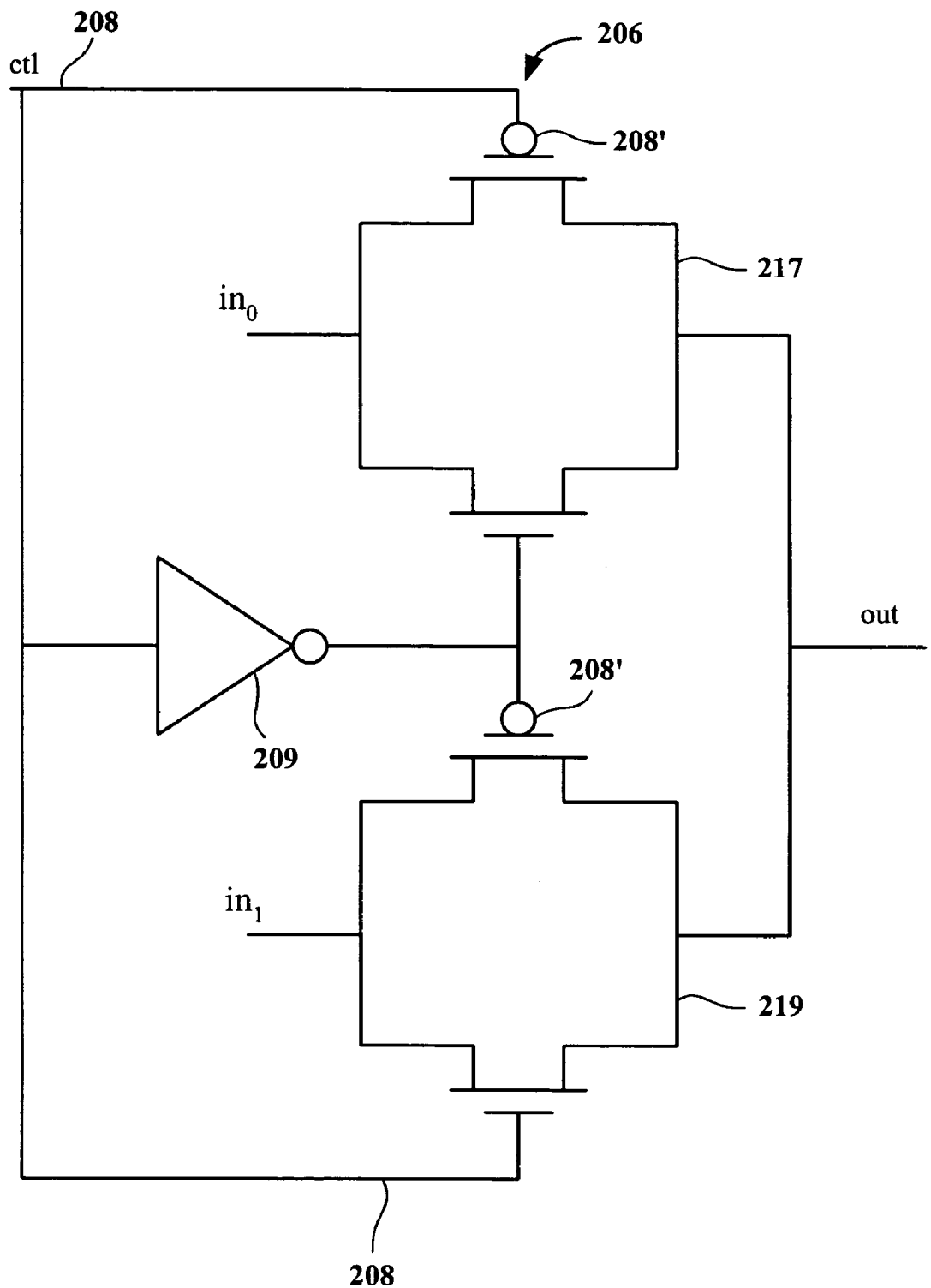
FIG. 2C shows a multiplexer in accordance with an embodiment of the invention

FIG. 2C shows the multiplexer 206 of FIG. 2 in accordance with an embodiment of the present invention. The multiplexer shows to include two gates 217 and 219. In one embodiment, the input to gate 217, i.e. in0, is the system address and the input to gate 219, i.e. in1, is the programmable-address. Both gates 217 and 219 are devised to receive both the control signal 208 and the inverted control signal 208'. Further, the control signal is shown to be inverted by inverter 209. Depending on the value of the control signal, the output of the multiplexer 206 is going to be either in0 or in1. In one embodiment, when the control signal is equal to zero the output of the multiplexer 206 is in0, i.e., the system address. When the control signal is equal to 1, the output of the multiplexer 206 is in, i.e., the programmable address.

Figure 3A:
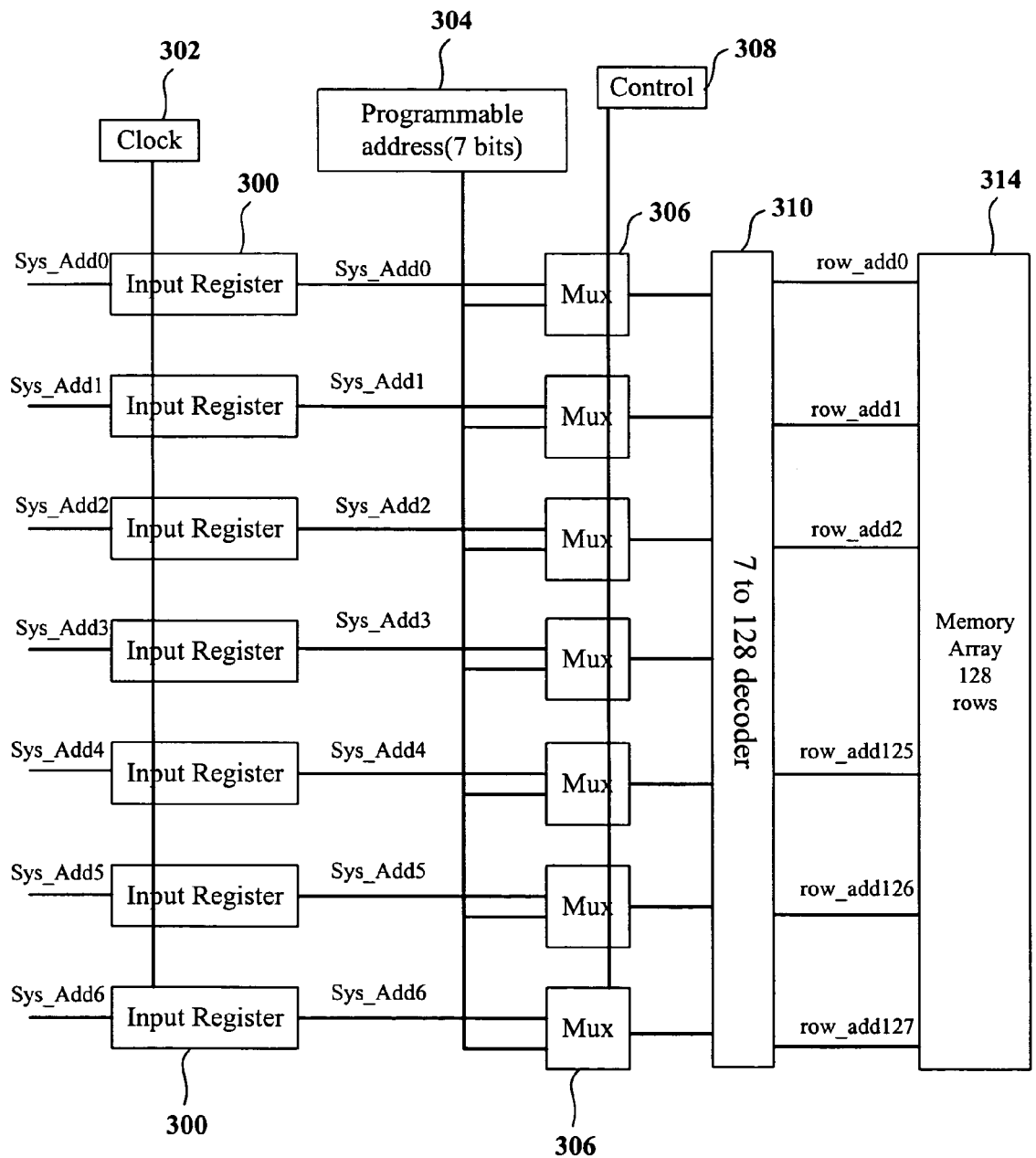
FIG. 3A, illustrates the layout for a system for generating addresses to initialize memory within a PLD in accordance with an embodiment of the invention.

FIG. 3A shows a layout for a system, for initializing memory within a PLD in accordance with an embodiment of the present invention. FIG. 3A includes input registers 300 for receiving data. In one embodiment, the data may be encoded system addresses. All the registers 300 function according to the same clock edge. The data are passed in an out of registers 300 at the rising edge, falling edge or a combination thereof with respect to the cycle of the clock 302. In FIG. 3A, the data are passed directly from the input registers 300 into the corresponding multiplexers 306. The multiplexers 306 also receive as inputs programmable addresses generated by the control block (not shown). The system addresses from input registers 300 are combined with the encoded programmable addresses 304 generated by the control block, 106 with reference to FIG. 1, to generate encoded final row addresses for the wordline of the memory array 314. During initialization, the multiplexers 306 are enabled by the control signal 308 that selects the programmable addresses. The encoded final row addresses of the wordline for the memory are then fed to a decoder 310. The decoder 310 then decodes the seven encoded row addresses to 128 decoded addresses for the memory array 314. The decoder 310 is shown to be a 7 to 128 decoder. One skilled in art will understand and appreciate that the decoder size is arbitrary and can vary according the size of the memory array 314. One of the advantages of the present embodiment is that the buffers that were required to drive the memory array shown in FIGS. 2A and 2B are eliminated, because the multiplexers are no longer at the final stage of the initialization process, i.e., the multiplexers are no longer driving the memory array. Here, the memory array 314 is driven by the decoder 310. A detailed description of the functions of the decoder 310 is provided below with respect to FIG. 3B.

Figure 3B:
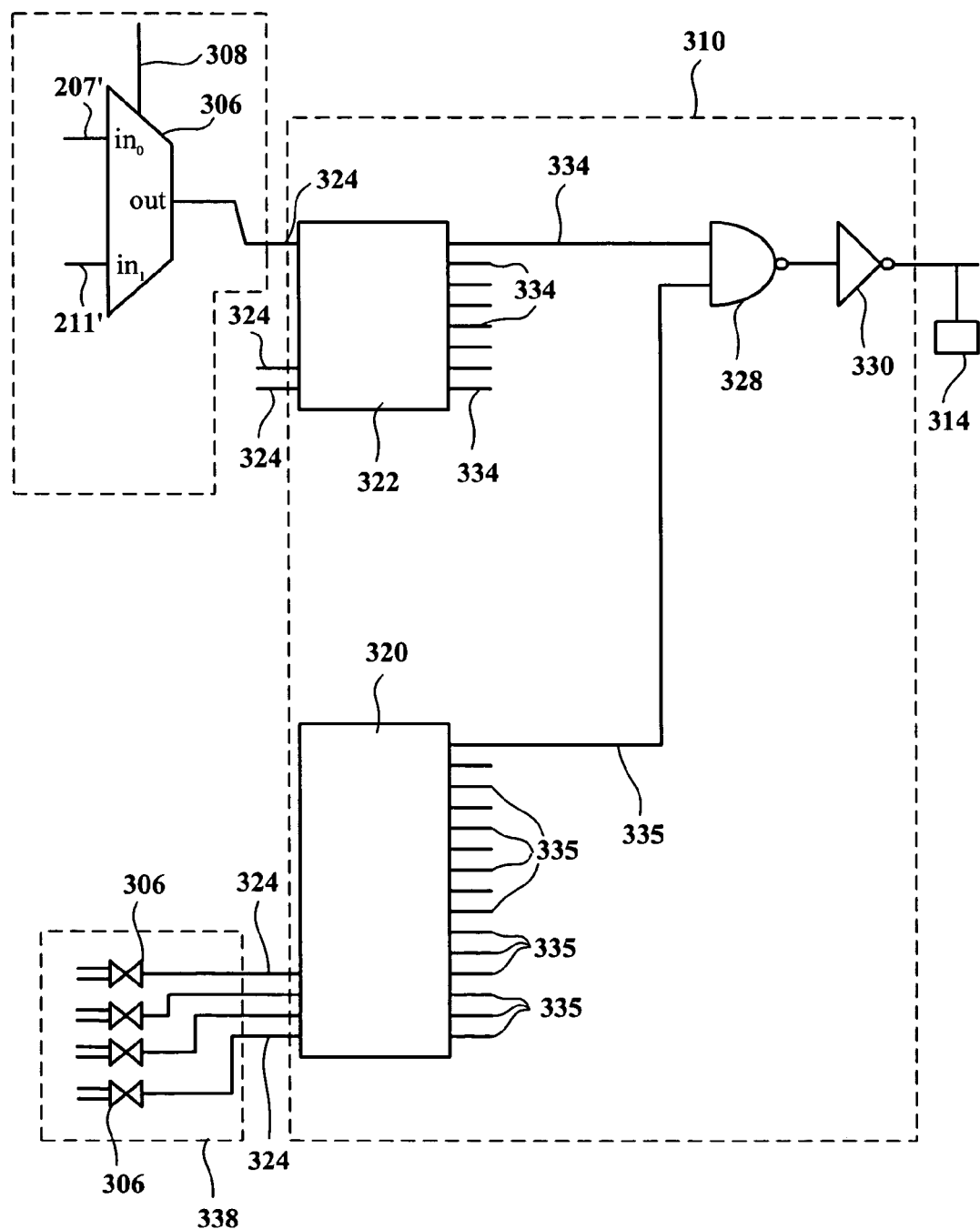
FIG. 3B is a simplified schematic representation of FIG. 3A in accordance with an embodiment of the present invention.

FIG. 3B is a simplified schematic representation of FIG. 3A. FIG. 3B includes multiplexers 306. The multiplexers are similar to the ones described above with respect to FIG. 2B, and the details of the functional aspects of the multiplexers are provided above. The number of multiplexers required depends on the size of the memory array. The number of multiplexers 306 needed in this example is 7. Unlike FIG. 2B, the multiplexers 306 in FIG. 3B receive encoded system addresses 207' and programmable addresses 211'. Therefore, the number of multiplexers required in this embodiment are only 7 compared to the 128 multiplexers of FIG. 2B. The output 324 from the multiplexers 306 is input to the decoders 320 and 322. The decoder 310 of FIG. 3A is illustrated within the block defined by the dotted lines. The decoder 310 of FIG. 3A includes two decoders 320 and 322. Decoder 320 decodes four input signals 324, i.e. the merged encoded system addresses and programmable addresses, to 16 output signals 335. Similarly, decoder 322 decodes three input signals 324, e.g., encoded system addresses and programmable addresses, to 8 output signals 334. One of the 16 output signals 335 from decoder 320 and one of the output signals 334 from decoder 322 are input to the NAND gate 328. The different combinations of the output signals from decoder 320 and 322 provide a total of 128 combinations of signals representing the 128 final row addresses of the wordline for the memory array 314. The decoder is further shown to include inverter 330. The inverter 330 is functioning as a buffer and the inverter is capable of driving the memory array 314. By utilizing the inverter 330 of the decoder 310, this embodiment reduces the number of gates needed by the system for initializing the memory of the PLD.

As can be seen, the embodiment described above with respect to FIGS. 3A and 3B can save considerable real estate space within the PLD. Firstly, the number of multiplexers are reduced from 128 to 7 as compared to the embodiment described in FIGS. 2A and 2B. As described above, the multiplexers are incapable of driving large memory arrays so additional buffers are needed to drive the memory array in the embodiments of FIGS. 2A and 2B. Since the decoders include inverters in its final stage, additional buffers needed to drive the memory array can be avoided. Also, by reducing the number of multiplexers and buffers, the conducting lines used for routing signals between the multiplexers and the buffers can be saved. Additionally, the speed of the device is improved by the elimination of buffers. Consequently, the maximum frequency the memory block can support is vastly improved.

Figure 4:
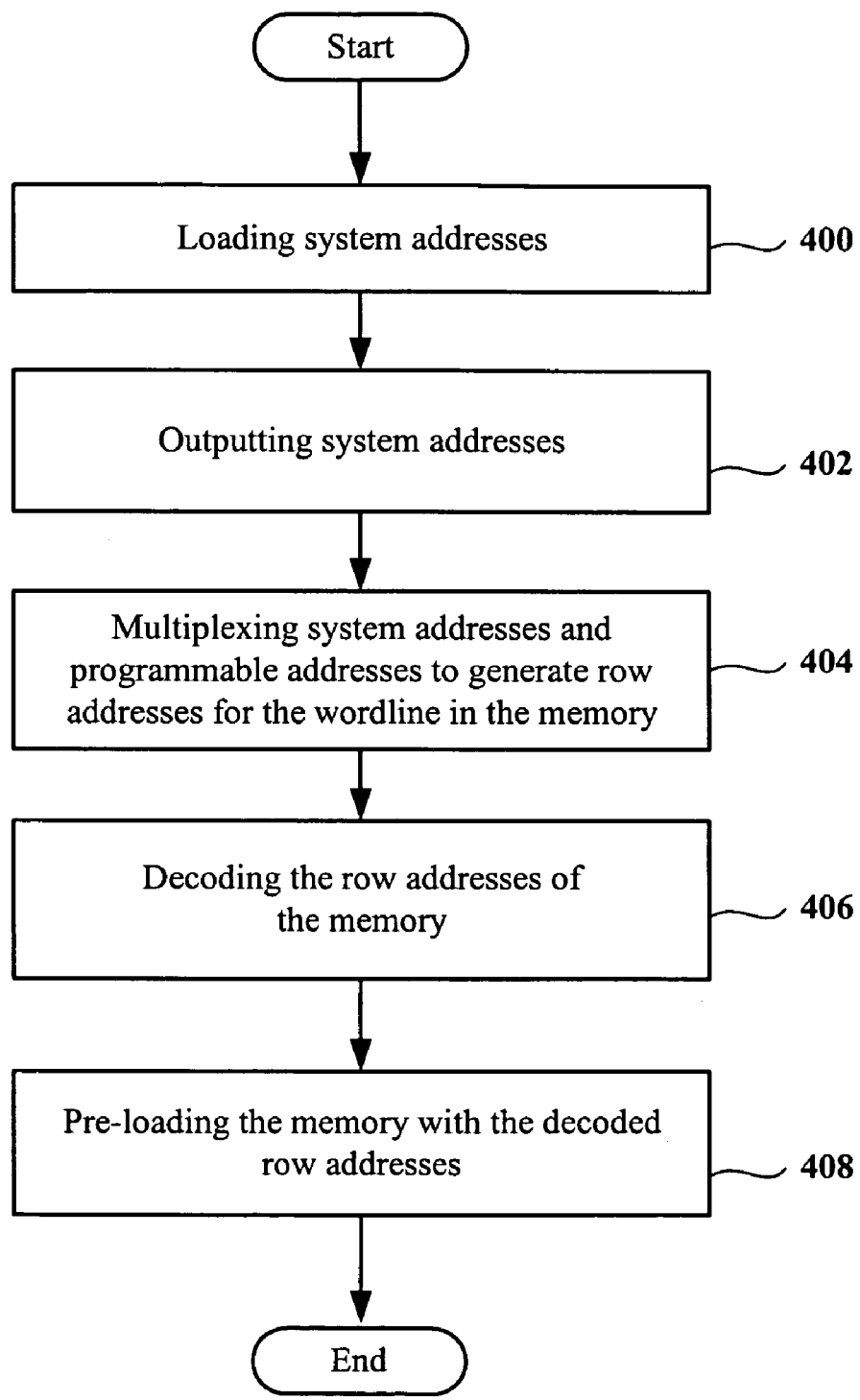
FIG. 4 is a flow chart illustrating the method of operations involved in initializing a memory within an embedded memory block in a PLD in accordance with an embodiment of the present invention.

FIG. 4 is a flow chart illustrating the method of operations involved in initializing an embedded memory block within a PLD, in accordance with an embodiment of the present invention. In operation 400, the system addresses are loaded into input registers. The system addresses are encoded in one embodiment. As described above, all the input registers are synchronized with the same clock edge. Accordingly, data are loaded into the input registers at a clock edge. The loaded data are then output from the registers at a subsequent clock edge, as indicated in operation 402. Next, in operation 404, the encoded system addresses and a plurality of encoded programmable addresses are loaded into a plurality of multiplexers. The loaded addresses are multiplexed to generate row addresses for the wordline in the memory. It should be appreciated that there is a one to one relationship between the amount of multiplexers and the amount of input registers therefore, the use of encoded programmable addresses enables the reduction in the amount of multiplexers, as illustrated with reference to FIG. 3A. Subsequently, the addresses are decoded in operation 406. The buffers, also referred to as inverters, included in the decoder are utilized to drive the loading of the memory. Thus, the memory in the PLD is preloaded using the decoded row addresses in operation 408, while minimizing the amount of multiplexers and buffers without sacrificing the speed of any performed operations.

The memory block occupies roughly 20% of the PLD core area, therefore, the savings in layout area achieved by the embodiments described herein can have a significant effect on the overall real estate space of the PLD. In one embodiment, for a 90 nm dual port SRAM block with 128 rows and 36 columns, the area saved is approximately 7% of the memory core area and 5% of the total SRAM block area (including memory interface and routing). Moreover, in case of FPGAs, core area savings was found to be around 1%. Additionally, cycle time was improved by 5% by reducing the delay caused by the two extra gates, which in turn resulted in an improvement in the maximum frequency the memory block can support.

The embodiments thus far were described with respect to PLDs. The embedded memory block described herein may be incorporated into any suitable integrated circuit. For example, the embedded memory block may be incorporated into other types of programmable logic devices such as programmable array logic (PAL), programmable logic array (PLA), field programmable logic array (FPLA), electrically programmable logic devices (EPLD), electrically erasable programmable logic device (EEPLD), logic cell array (LCA), just to name a few. The programmable logic device may be a part of a data processing system that includes one or more of the following components: a processor, memory; I/O circuitry, and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A circuit configurable to generate addresses for memory initialization within a programmable logic device (PLD), comprising:
    a plurality of input registers storing system addresses for a memory array;
    a plurality of multiplexers enabled to select between output of the system addresses from respective input registers and encoded programmable addresses provided to each of the plurality of multiplexers; and
    a decoder enabled to decode an encoded row address for a wordline of memory received from one of the plurality of multiplexers.

2. The circuit of claim 1, wherein the PLD is a field programmable gate array (FPGA), and wherein the encoded programmable addresses provide a configuration for the FPGA.

3. The circuit of claim 1, wherein the decoder is one of a plurality of decoders and wherein each decoder includes a first decoder for decoding a first portion of selected signals from the plurality of multiplexers and a second decoder for decoding a remaining portion of selected signals from the plurality of multiplexers.

4. The circuit of claim 1, wherein the multiplexer comprises cascaded p type and n type metal oxide semiconductors.

5. The circuit of claim 1, further comprising:
    a control block providing the encoded programmable addresses.

6. The circuit of claim 1, wherein the decoder includes a buffer.

7. The circuit of claim 6, wherein the buffer is an inverter.

8. A method of generating addresses for memory initialization in an embedded memory block within a programmable logic device (PLD), comprising:
    outputting a system address and a programmable address to a corresponding multiplexer;
    selecting between one of the system address and the programmable address to generate encoded row addresses for a wordline of memory within the embedded memory block;
    decoding the encoded row addresses; and
    loading the memory with the decoded row addresses.

9. The method of claim 8 wherein the generating encoded row addresses includes multiplexing the system addresses with an encoded programmable address.

10. The method of claim 8, further comprising: loading system addresses into a plurality of input registers.

11. The method of claim 8, wherein the decoding the row addresses includes buffering the row addresses.

12. The method of claim 10, wherein the loading system addresses includes encoding the system addresses.

13. The method of claim 8, wherein the generating encoded row addresses includes receiving seven encoded system addresses and seven encoded programmable addresses.

14. The method of claim 13, wherein the seven encoded system addresses and the seven encoded programmable addresses are multiplexed and decoded into 128 row addresses.

15. A method for efficient memory initialization in a PLD, comprising:

loading encoded programmable addresses into a plurality of multiplexers;

multiplexing the programmable addresses with corresponding system addresses to define encoded row addresses; and decoding the encoded row addresses.

16. The method of claim 15 further including loading the decoded row addresses into memory within the PLD.

17. The method of claim 15, wherein the PLD is selected from a group consisting of a field programmable gate array (FPGA), programmable array logic (PAL), programmable logic array (PLA), field programmable logic array (FPLA), electrically programmable logic devices (EPLD), electrically erasable programmable logic device (EEPLD), logic cell array (LCA).

18. The method of claim 15, wherein the decoding the encoded row addresses includes buffering the decoded row addresses.

19. The method of claim 18, wherein the buffering enables a memory array within the memory block of the PLD to be driven.

20. The method of claim 15, wherein the multiplexing includes selecting one of the programmable addresses to combine with an encoded system address.

\* \* \* \* \*